(12) United States Patent
Lou

(10) Patent No.: US 6,218,285 B1
(45) Date of Patent: *Apr. 17, 2001

(54) METHOD FOR FORMING INTER-METAL DIELECTRIC LAYERS IN METALLIZATION PROCESS

(75) Inventor: Chine-Gie Lou, Hsinchu Hsien (TW)

(73) Assignee: Worldwide Semiconductor Manufacturing Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/387,506

(22) Filed: Sep. 1, 1999

(30) Foreign Application Priority Data

Jul. 20, 1999 (TW) .................................. 88112339

(51) Int. Cl.[7] ................................. H01L 21/4763
(52) U.S. Cl. ..................... 438/624; 438/634; 438/691
(58) Field of Search .................... 438/624, 699, 438/695, 631, 633, 634, 632, 691, 692, 703, 626

(56) References Cited

U.S. PATENT DOCUMENTS

| | | | | |
|---|---|---|---|---|
| 5,064,683 | * | 11/1991 | Poon et al. | 427/39 |
| 5,393,708 | * | 2/1995 | Hsia | 437/228 |
| 5,665,633 | * | 9/1997 | Meyer | 438/427 |
| 5,783,482 | * | 7/1998 | Lee | 438/624 |
| 5,817,571 | * | 10/1998 | Yu | 438/622 |
| 5,837,618 | * | 11/1998 | Avanzino | 438/778 |
| 5,872,064 | * | 2/1999 | Huff | 438/778 |
| 5,880,018 | * | 3/1999 | Boeck | 438/619 |

* cited by examiner

Primary Examiner—Charles Bowers
Assistant Examiner—Erik Kielin

(57) ABSTRACT

The method for forming inter-metal dielectric layers in a metallization process mainly includes the following steps. At first, a semiconductor substrate having interconnection structures formed thereon is provided. A liner layer is formed to cover the interconnection structures and the substrate, and a first dielectric layer is formed on the liner layer. A planarization stop layer is formed on the first dielectric layer and a second dielectric layer is formed on the planarization stop layer, wherein the second dielectric layer has a higher removal rate than the planarization stop layer in a planarization process. Finally, the substrate is planarized by removing portions of the second dielectric layer until portions of the planarization stop layer is presented.

9 Claims, 2 Drawing Sheets

METHOD FOR FORMING INTER-METAL DIELECTRIC LAYERS IN METALLIZATION PROCESS

FIELD OF THE INVENTION

The present invention relates to semiconductor fabrication, and more specifically relates to a method of intermetal dielectric layers. A method for forming inter-metal dielectric layers is proposed to improve the controllability of planarization processes.

BACKGROUND OF THE INVENTION

The semiconductor has been developed for four decades from the birth of the first semiconductor device. For performing more complicate operations with higher speed, more and more devices and connections are formed within a circuit. The density of semiconductor chips are raised to include more devices and functions in a single chip. In the integrated circuits, a great number of devices and connections are fabricated on a single chip. Various kinds of devices like transistors, resistors, and capacitors are formed together. Each device must operate with the good connections to provide interaction between each other for completing the functionality, especially under the higher and higher packing density of the integrated circuits.

Connections must be formed between these densely arranged devices for finishing a circuit to perform operations. In the semiconductor manufacturing process, metallization is a process for forming connections between devices. With more and more devices on a chip under high integrity, early stage single layer metallization process had been improved to form multiple layer of connections. Two layers, three layers, or even four layers of connections are formed in present applications. With the sub-micrometer or even smaller devices, the metallization process is challenged with forming narrower conductive lines with compromising resistance. More layers of connections must be formed with low misalignment and good yield.

For fabricating high density devices like ULSI (ultra-large scale integration) devices, metallization with small pitch and multilevel-structure become necessary for providing high packing density with reliable functionality. In the metallization process, the planarization process is a vital role in providing accurately defined conductive paths and densely packed connections. The demand for more levels of metal wiring in the integrated circuits of complexity has greatly raised the need for the global planarity and dielectric characteristics of inter-metal dielectric (IMD) layers.

Without limiting the scope and the spirit of the present invention, a typical metallization process on forming an inter-metal dielectric layer is illustrated. Referring to FIG. 1, a substrate 10, generally having devices like transistors and/or capacitors formed thereon, is provided for making interconnections between devices. A metal layer is formed on the substrate 10 and is then patterned to define metal wiring or interconnection structures such as 12a and 12b illustrated in the figure. A liner oxide 14 is formed to cover over the interconnection structures 12a and 12b.

Following the liner oxide layer 14, a first dielectric layer 16 covers over the liner oxide layer 14. Since the pitch between the interconnection structures 12a and 12b are tight for present stage high density circuits, a dielectric layer with very low dielectric constant (K), such as a low-K organic layer, is employed as the first dielectric layer 16, in order to reduce the RC constant between the interconnection structures 12a and 12b and between metal layers of different levels. A second dielectric layer 18 then covers over the first dielectric layer 16 to serve as a top layer of the composite inter-metal dielectric layer. The second dielectric layer 18 is generally a silicon oxide layer.

In the typical metallization process, a planarization process is performed after the formation of the second dielectric layer 18, in order to improve the topography of the composite inter-metal dielectric layer and provide a planar surface for forming next layer of conductive wires accurately. The second dielectric layer 18 is polished to leave a portion of the second dielectric layer 18 to cover over the first dielectric layer 16, such as the left portion 18a of the second dielectric layer 18 illustrated in FIG. 2. As an example, the left portion 18a is about a thousand angstroms to several thousand angstroms. In the conventional planarization processes, a chemical-mechanical polish (CMP) is applied to planarize the second dielectric layer.

However, during the planarization of the second dielectric layer 18, the polishing process is difficult to control. Since the whole polishing process is carried out and also stop on the same material of silicon oxide, no endpoint for the polishing process can be clearly defined. Under the same-layer polishing without identified endpoint or stop layer, the uniformity of the polishing process, including within-wafer uniformity and wafer-to-wafer uniformity, can be greatly damaged. Some of the regions on the wafer may be over-polished to damage the insulation characteristics and some of the regions may be under-polished to reduce the essential planarity for accurately defining metal wiring. The yield and reliability of the products are also decreased.

Furthermore, the conventional chemical-mechanical polish process, under the mechanical polishing of the abrasive particles, has the problem of scratches on the polished surface. Therefore, as shown in FIG. 2, the polishing step will result in a plurality of scratch defects on the remained second dielectric layer 18a. The scratch defects can be recessed regions, shallow channels, or small holes. In the plug-formation process, the deposition and etch-back of a conductive layer to form a plug 20 will leave some conductive material in the scratch defects, thus form some micro wirings such as 20a and 20b. The present of the micro wirings 20a and 20b, which might have conductive connections with plugs or conductive paths, will lead to the formation of undesired contacts, leakage paths, or short connections between individual paths and damage the functionality of integrated circuits.

SUMMARY OF THE INVENTION

The present invention proposes a method for forming inter-metal dielectric layers in a metallization process. The planarization process of forming inter-metal dielectric layers can be accurately controlled. A composite structure of inter-metal dielectric layers is provided with excellent uniformity and free of surface defects. The reliability and yield of the metallization process can be improved.

The method for forming inter-metal dielectric layers in a metallization process mainly includes the following steps. At first, a semiconductor substrate having interconnection structures formed thereon is provided. A liner layer is formed to cover the interconnection structures and the substrate, and a first dielectric layer is formed on the liner layer. A planarization stop layer is formed on the first dielectric layer and a second dielectric layer is formed on the planarization stop layer, wherein the second dielectric layer has a higher removal rate than the planarization stop layer in a planarization process. Finally, the substrate is planarized by removing portions of the second dielectric layer until portions of the planarization stop layer is presented.

In the preferred embodiments, a series of steps are further performed to form another layer of interconnections. At first, a third dielectric layer is formed over the substrate. Portions of the third dielectric layer the planarization stop layer, the first dielectric layer and the liner layer are then removed to define via holes therein extending to portions of the interconnection structures. Overlying interconnection structures are then formed on the third dielectric layer and within the via holes.

In the preferred case, the removal rate of the second dielectric layer is more than 50 times than that of planarization stop layer in the planarization process. Besides, the planarizing step is carried out with a chemical-mechanical polishing in the preferred embodiments.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows.

DETAILED DESCRIPTION OF THE PREFERRED EMBODIMENT

The present invention proposes a method for forming inter-metal dielectric layers in a metallization process. The method provides a stop layer for the planarization process of forming inter-metal dielectric layers and improves the controllability of the planarization process. A composite structure of inter-metal dielectric layers is provided with excellent uniformity and free of surface defects. The reliability and yield of the metallization process can be improved.

Figure 1:
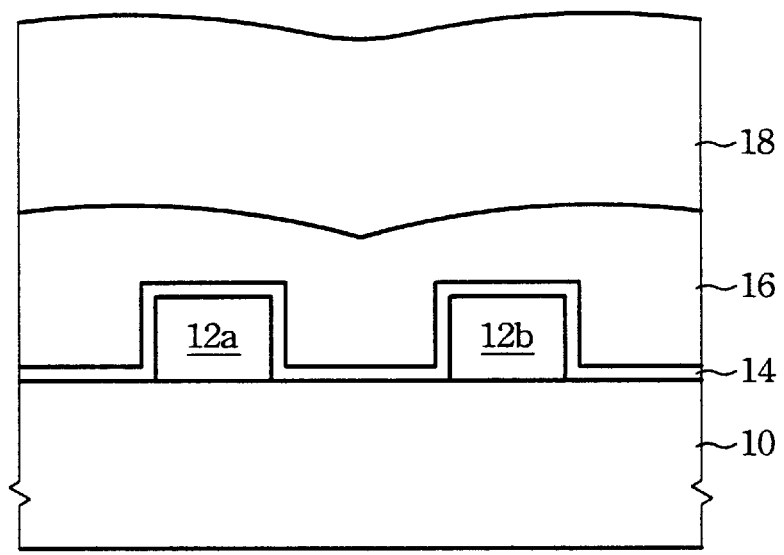
FIG. 1 illustrates a cross sectional view of forming inter-metal dielectric layer on a semiconductor substrate in the prior art.
Figure 2:
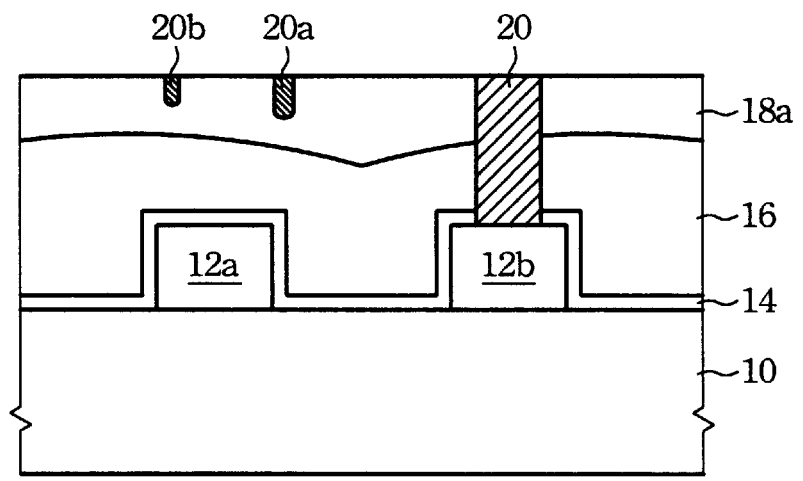
FIG. 2 illustrates a cross sectional view of polishing the top silicon oxide layer and forming conductive plugs in the prior art.
Figure 3:
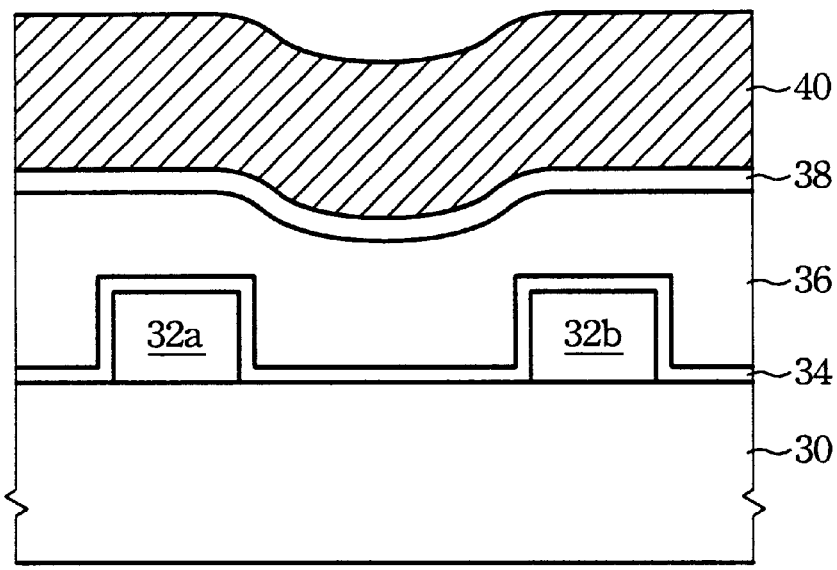
FIG. 3 illustrates a cross sectional view of forming a liner layer, a first dielectric layer, a planarization stop layer, and a second dielectric layer on a substrate in accordance with the present invention.

Referring to FIG. 3, a cross sectional view of a semiconductor is illustrated. For forming interconnections in the metallization process, the semiconductor substrate 30 is provided and finished with the formation of operational devices like transistors, resistors, and capacitors. In the case, the substrate 30 has a dielectric layer underlying the first layer of metal connections to cover over the integrated circuit devices. The dielectric layer is formed by chemical vapor deposition, with the material such as TEOS-oxide (tetra-ethyl-ortho-silicate oxide), BPSG (borophosphosilicate glass), PSG (phosphosilicate Glass), and BSG (borosilicate glass). Without limiting the scope and the spirit of the present invention, a typical metallization process on forming an inter-metal dielectric layer is illustrated.

At first, a metal layer is formed on the substrate 30 and is then patterned to define metal wirings or interconnection structures such as 32a and 32b illustrated in the figure. A liner oxide 34 is formed to cover over the interconnection structures 32a and 32b, and also the underlying dielectric layer on the substrate 30. In the preferred embodiments, the liner oxide 34 is a silicon oxide layer formed by a conventional chemical vapor deposition (CVD) process. The liner oxide 34 covering each individual interconnection structure to provide a basic insulative protection. The liner oxide 34 can be a TEOS (tetra-ethyl-ortho-silicate oxide)-oxide in the case. The liner oxide 34 is about 300 to 1000 angstroms in thickness.

Following the liner oxide layer 34, a first dielectric layer 36 covers over the substrate 30 on the liner oxide layer 34. As what is illustrated in the background of the invention, since the pitch between the interconnection structures 32a and 32b are tight for present stage high density circuits, a dielectric layer with very low dielectric constant (K), such as a low-K organic layer, is employed as the first dielectric layer 36, in order to reduce the RC constant between the interconnection structures 32a and 32b and between different metal layers. In the preferred embodiments, the first dielectric layer 36 is can be any dielectric layer which has a dielectric constant between about 2 to 3, or has an even lower value of dielectric constant. As an example, the material includes organic material such as polymer.

In the case, a chemical vapor deposition (CVD) process or a spin-on coating process can be employed to form the first dielectric layer 36 of low-K dielectrics, depending on the material used and the expected topography. In the region between interconnection structures 32a and 32b, the first dielectric layer 36 may has a recessed shape due to the surface topography.

A planarization stop layer 38 is then formed on the first dielectric layer 36. A plurality of materials can be employed as the planarization stop layer 38 if the characteristics of the materials fulfills the requirements. In the preferred embodiments, the planarization stop layer 38 should provide good dielectric characteristics, and the dielectric constant of the planarization stop layer 38 is between about 2.5 to 7. Besides, the removal rate of the planarization stop layer 38 in the planarization process should be much lower than that of a second dielectric layer 40 covering above, in order to provide good polish-stop effects.

In the case, the planarization stop layer 38 and the second dielectric layer 40 are selected to make the second dielectric layer 40 has a removal rate more than 50 times the removal rate of the planarization stop layer 38. Moreover, the planarization stop layer may be selected to have a good thermal conductivity.

Next, the second dielectric layer 40 is formed on the planarization stop layer 38. As aforementioned requirements, the second dielectric layer 40 has a higher removal rate than the planarization stop layer 38 in the planarization process carried out later. For general insulation purposes, the second dielectric layer 40 is a silicon oxide layer in the case. In the preferred embodiments, the silicon oxide layer is formed by a spin-on-glass (SOG) process to form the second dielectric layer 40 on the planarization stop layer 38 with good coverage. The dielectric constant of the second dielectric layer 40 is about 2 to 5 in the case. For the second dielectric layer 40, the planarization stop layer 38 can be aluminum nitride (AlN) and can be formed with physical vapor deposition process.

Figure 4:
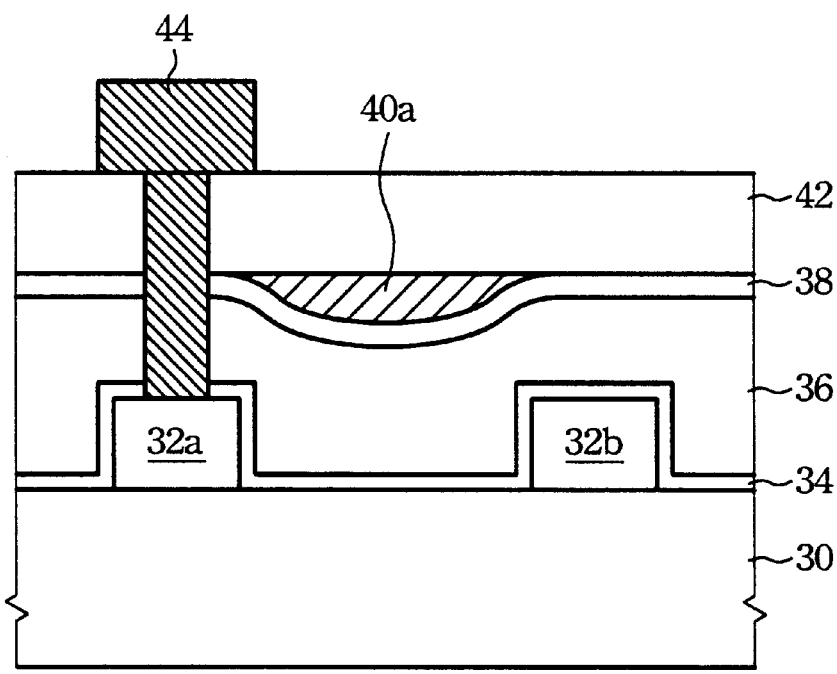
FIG. 4 illustrates a cross sectional view of planarizing the substrate, forming a third dielectric layer, defining via holes, and forming overlying interconnection structures in accordance with the present invention.

Turning to FIG. 4, the substrate 30 is then planarized by removing portions of the second dielectric layer 40 on top, until portions of the planarization stop layer 38 is presented, in order to improve the topography of the composite inter-metal dielectric layer and provide a global planar surface for forming next layer of planar dielectric layer or accurately defined conductive wires. In the preferred embodiments, a chemical-mechanical polish (CMP) is applied to planarize the top portions of the second dielectric layer 40, preferably with accompanying oxide-removing slurries. In the case of using silicon oxide as the second dielectric layer 40 and aluminum nitride as the planarization stop layer 38, the second dielectric layer 40 has a removal rate more than 80 times the removal rate of the planarization stop layer 38 in the polishing process.

In the polishing process, the planarization stop layer 38 serves as a stop layer of polishing endpoint with its relative low removal rate in the polishing process of removing the overlying second dielectric layer 40. With its relative low removal rate to the chemical-mechanical polish, the polishing endpoint can be easily detected. The whole wafer is polished with excellent uniformity since the polishing process is stopped at the region where the planarization stop layer 38 is reached. The controllability and the uniformity of the process is raised. Portions of the second dielectric layer 40, such as 40*a* as indicated in the figure, remain in the recessed regions after the polishing process.

In the preferred embodiments, a third dielectric layer 42 can be further formed over the substrate 30 to cover on the remained second dielectric layer 40*a* and the planarization stop layer 38. In the preferred embodiments, the third dielectric layer 42 is a silicon oxide layer formed by a conventional chemical vapor deposition (CVD) process or preferably a plasma-enhanced chemical vapor deposition (PECVD) process. The silicon oxide can be a TEOS (tetra-ethyl-ortho-silicate oxide)-oxide in the case. Portions of the third dielectric layer 42, the planarization stop layer 38, the first dielectric layer 36, and the liner oxide layer 34 are then removed to define via holes therein extending to portions of the interconnection structures, like the interconnection structure 32*a* in the figure.

Interconnection structures 44 are then formed on the third dielectric layer 42 and within the via holes to form the connection paths. In general, an overlying metal layer is formed on the third dielectric layer 42 and within the via holes, and the overlying metal layer is patterned to form the overlying interconnection structures 44. Alternatively, the conductive material in the via holes can be formed with another plug-formation process. Having the covering third dielectric layer 42 over the remained second dielectric layer 40*a* and the planarization stop layer 38, the surface scratches of the polishing process can be covered and prevented from forming conductive paths therein by metal residues.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method for forming inter-metal dielectric layers in a metallization process, said method comprising the steps of:

providing a semiconductor substrate having interconnection structures formed on an underlying dielectric layer on said substrate;

forming a liner layer covering said interconnection structures and said underlying dielectric layer;

forming a first dielectric layer on said liner layer;

forming an aluminum nitride layer on said first dielectric layer;

forming a second dielectric layer on said aluminum nitride layer; and planarizing said substrate by removing portions of said second dielectric layer with chemical mechanical polishing until portions of said aluminum nitride layer is presented, wherein a removal rate of said second dielectric layer is more than 50 times a removal rate of said aluminum nitride layer in said planarization process.

2. The method of claim 1 further comprising the steps of:

forming a third dielectric layer over said substrate;

removing portions of said third dielectric layer, said planarization stop layer, said first dielectric layer, and said liner layer to define via holes therein extending to portions of said interconnection structures; and forming overlying interconnection structures on said third dielectric layer and within said via holes.

3. The method of claim 2, wherein said third dielectric layer comprises TEOS-oxide (tetra-ethyl-ortho-silicate oxide) which is deposited by a chemical vapor deposition.

4. The method of claim 2, wherein said step of forming said overlying interconnection structures comprises the steps of:

forming an overlying metal layer on said third dielectric layer and within said via holes; and patterning said overlying metal layer to form said overlying interconnection structures.

5. The method of claim 1, wherein said underlying dielectric layer is formed by chemical vapor deposition, and said underlying dielectric layer is selected from the group consisting of TEOS-oxide (tetra-ethyl-ortho-silicate oxide), BPSG (borophosphosilicate glass), PSG (phosphosilicate Glass), and BSG (borosilicate glass).

6. The method of claim 1, wherein said liner layer comprises a silicon oxide layer deposited with a chemical vapor deposition.

7. The method of claim 1, wherein said first dielectric layer comprises a low dielectric constant layer having a dielectric constant between about 2 to 3.

8. The method of claim 1, wherein said first dielectric layer comprises an organic layer.

9. The method of claim 1, wherein said aluminum nitride layer has a dielectric constant between about 2.5 to 7.

\* \* \* \* \*